United States Patent [19]

Berkman et al.

[11] 4,090,851
[45] May 23, 1978

[54] Si₃N₄ COATED CRUCIBLE AND DIE MEANS FOR GROWING SINGLE CRYSTALLINE SILICON SHEETS

[75] Inventors: Samuel Berkman, Florham Park; Kyong-Min Kim, East Windsor; Harold Edgar Temple, Trenton, all of N.J.

[73] Assignee: RCA Corporation, New York, N.Y.

[21] Appl. No.: 732,865

[22] Filed: Oct. 15, 1976

[51] Int. Cl.² .................... B01J 17/18; C01B 33/02
[52] U.S. Cl. ........................ 23/273 SP; 156/608; 156/617 SP; 156/DIG. 64; 156/DIG. 83; 156/DIG. 88; 432/264; 432/265; 427/94
[58] Field of Search ............ 23/273 SP; 156/608, 156/613, 614, 617 SP, DIG. 64, DIG. 83, DIG. 84, DIG. 88; 432/264, 265; 427/237, 94, 419 F; 423/344, 325

[56] References Cited

U.S. PATENT DOCUMENTS

| 3,002,824 | 10/1961 | Francois | 156/DIG. 83 |
|---|---|---|---|
| 3,129,061 | 4/1964 | Dermatis et al. | 156/DIG. 84 |
| 3,226,194 | 12/1965 | Kuntz | 423/344 |
| 3,341,361 | 9/1967 | Gorski | 156/DIG. 88 |
| 3,393,054 | 7/1968 | Rupprecht et al. | 23/273 SP |
| 3,413,090 | 11/1968 | Krock et al. | 156/614 |
| 3,453,352 | 7/1969 | Goundry | 156/608 |
| 3,650,703 | 3/1972 | LaBelle, Jr. et al. | 156/DIG. 88 |
| 3,922,475 | 11/1975 | Manasevit | 156/613 X |
| 4,000,030 | 12/1976 | Ciszek | 156/608 |

FOREIGN PATENT DOCUMENTS

656,987  11/1965  Belgium .................. 156/DIG. 83

OTHER PUBLICATIONS

Croft Rev. of Ceramic Technology, #26, Feb. 1974, pp. 1-12.

*Primary Examiner*—Stephen J. Emery
*Attorney, Agent, or Firm*—H. Christoffersen; B. E. Morris; A. Stephen Zavell

[57] ABSTRACT

Mechanical components, e.g. die and/or crucible or the like structures with which single silicon crystals are grown from the melt as shaped articles in thin sheet or ribbon geometry, are advantageously comprised, for their material of construction, of a suitable thermally stable and inert foundation substrate coated or provided on at least the silicon-contacting surface(s) thereof with a thin, uniform, integral surface layer deposit of pyrolitic silicon nitride ($Si_3N_4$) obtained by the chemical vapor deposition (i.e., "CVD") technique.

2 Claims, 6 Drawing Figures

$Si_3N_4$ COATED CRUCIBLE AND DIE MEANS FOR GROWING SINGLE CRYSTALLINE SILICON SHEETS

BACKGROUND OF THE INVENTION

Silicon single crystals in thin sheet form are desirable for several important reasons. They achieve materials savings in silicon utilization and provide product use possibilities in photovoltaic (solar cell) installations. They also offer a very low cost potential of making semiconductor ribbon by continuous process means for subsequent device fabrication.

Several investigators have explored various methods of growing single crystalline silicon sheet. Some of the known art for the purpose is revealed, amongst other sources, in: an article by J. V. Stepanov in Soviet Physics — Technical Physics, 29, 339 (1959); an article by J. C. Swartz, T. Surek and B. Chalmess in J. Electronic Materials, 4, 255 (1975); a report dated Dec. 15, 1975 prepared by G. H. Schmuttke et al entitled "SILICON RIBBON GROWTH BY A CAPILLARY ACTION SHAPING TECHNIQUE" identified as Quarterly Technical Progress Report No. 2 under JPL Contract No.: 954144 (a Subcontract under NASA Contract NAS7-100 - Task Order No. RD-152); and a presentation of J. A. Fautendyk at the "International Solar Energy Society Conference 'Sharing The Sun'" made Aug. 16 – 20, 1976 at Winnepeg, Manitoba, Canada and entitled "DEVELOPMENT OF LOW-COST SILICON CRYSTAL GROWTH TECHNIQUES FOR TERRESTRIAL PHOTOVOLTAIC SOLAR ENERGY CONVERSION". U.S. Pat. Nos. 3,393,054; 3,591,348; and 3,617,223 also pertain to this technology. So does the present Applicants' copending U.S. Patent Application entitled "APPARATUS FOR THE PRODUCTION OF RIBBON SHAPED CRYSTALS", Ser. No. 680,072, filed Apr. 26, 1976.

Three of the more widely employed procedures for single crystalline silicon sheet growth are known as: (i) the "Stepanov Technique"; (ii) the "Inverted Stepanov Technique"; and (iii) "Edge-Defined Film-Fed Growth" (i.e., "EFG"); plus various modifications thereof (and not excluding the more conventional Czochralski silicon crystal growth method). One of the essential differences between the first three of the specified procedures lies in the contact angle ($\phi$) between the molten silicon and the die material. For EFG, $\phi$ should be much smaller than 90°. On the other hand, $\phi$ should be larger than 90° in the Stepanov Technique, while it can be more or less than 90° in the Inverted Stepanov Technique.

Molten and near molten (e.g., solidifying from the melt) silicon is extremely and unusually reactive. It tends (even at temperatures as low as 100° C. or so below its melting point to those where it may actually be vaporized) to attack or corrode and/or become undesirably contaminated by practically all of the die and crucible materials that have been employed for growing single crystalline silicon sheet. This, obviously, is very disadvantageous.

The present invention, quite beneficially, provides a greatly improved material of construction for die and/or crucible components in silicon crystal growth operations and for handling molten silicon through its solidification therein.

SUMMARY OF THE INVENTION

According to the present invention, a thin, protective film of high purity, pyrolitic silicon nitride, applied by CVD techniques, is provided on at least a portion of the surface of the die and/or crucible employed to shape a growing silicon ribbon or sheet.

PARTICULARIZED DESCRIPTION OF THE INVENTION

Figure 1:
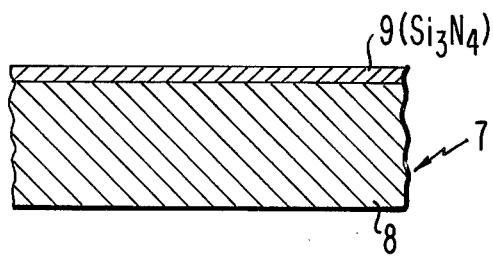
FIG. 1 is a schematic cross-sectional view of part of a $Si_3N_4$ coated apparatus component according to the present invention.
Figure 2:
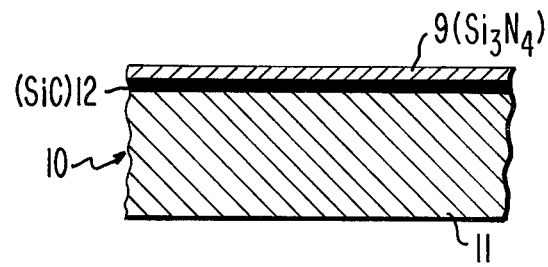
FIG. 2, in a view analogous to that of FIG. 1, illustrates a coated graphite substrate.
Figure 3:
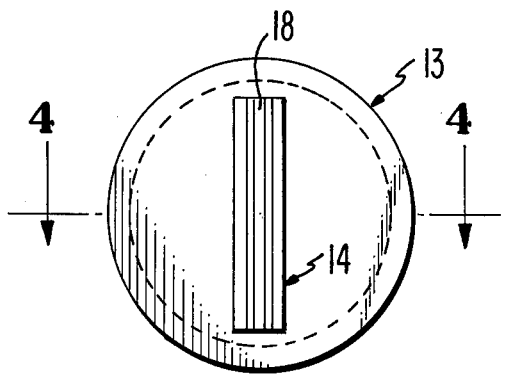
FIG. 3 is a simplified bottom plan view of apparatus (and the associated technique) pursuant to the invention illustrating Inverted Stepanov silicon crystal growth)
Figure 5:
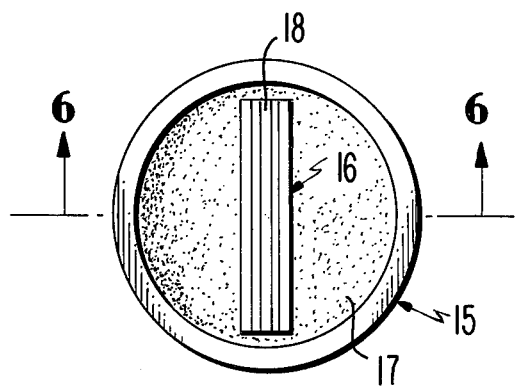
FIG. 5 is a simplified top plan view of apparatus (and also the associated technique) of the invention illustrating EFG silicon crystal growth.
Figure 4:
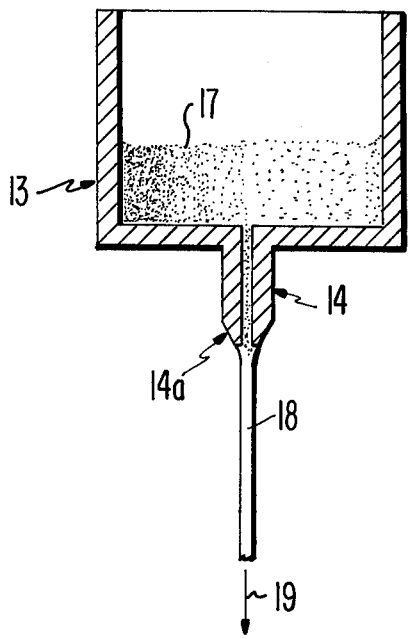
FIG. 4 is a schematic cross-sectional view taken along Line 4—4 in FIG. 3.
Figure 6:
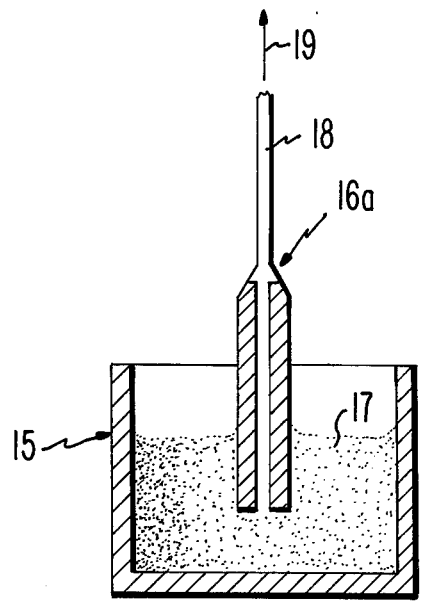
FIG. 6 is a schematic cross-sectional view taken along Line 6—6 of FIG. 5.

The silicon nitride-coated component of the present invention is elementarily described with respect to FIGS. 1 and 2 of the Drawing. In FIG. 1, a coated structural member for a die, crucible or the like is identified generally by reference numeral 7. It has a CVD applied film layer 9 of $Si_3N_4$ over an inert substrate 8. In FIG. 2, the $Si_3N_4$ layer 9 is deposited over an appropriately formed graphite substrate 11. During the CVD operation, a thin silicon carbide (SiC) interface 12 is formed between $Si_3N_4$ layer 9 and graphite substrate 11.

With reference to FIGS. 3 – 6, inclusive, the respectively involved crucibles and dies are sequentially designated by reference numerals 13, 14, 15 and 16. Dies 14 and 16 are each respectively formed to have terminating outlet apices 14a and 16a. The liquid silicon melt 17 (which generally is at least about 1420° C. in temperature) is, in each case, contained within crucibles 13 and 15. The thin sheet or ribbon of single crystalline silicon formed from each die is identified by reference numeral 18 as each proceeds from the die members 14 and 16 in the silicon ribbon growth direction indicated in each instance by directional arrow 19.

Although not detailed in FIGS. 3 – 6, the crucibles 13 and 15 and die members 14 and 16 are silicon nitride coated structures in accordance with the present invention fashioned as depicted in FIG. 1 and/or FIG. 2 of the Drawing.

The silicon nitride overlayer coating for the apparatus-forming substrate has exceptional physical properties for the instant application. These include good mechanical stiffness; high thermal conductivity; and a compatible coefficient of thermal expansion which particularly well adapts it to the intended purpose. At the same time, the CVD-applied silicon nitride overlayer is chemically inert and stable and is not corroded by, or contaminating to, molten silicon, regardless of actual contact under the most harsh and vigorous conditions. It is also readily wettable by molten silicon. These features complete the general fine suitability in and for practice of the present invention of the $Si_3N_4$ coated structural members.

Many of the characteristics of silicon nitride are detailed in the February, 1974 (Issue No. 24) "REVIEW OF CERAMIC TECHNOLOGY" by W. Duckworth published by the Battelle Columbus Laboratories. Additional information by J. C. Swartz is in J. American Ceramic Society, 59 (No. 5 - 6), 272 (1976).

The CVD procedure for providing the silicon nitride layer on the constructional substrate obtains a very good film deposition of the $Si_3N_4$ coating which exerts very little drag and minimized interferences with the single silicon crystal formations being grown with the apparatus embodiments of the present invention. The wettability of $Si_3N_4$ by molten silicon is an important factor in this.

As are known, effective CVD procedures for producing $Si_3N_4$ coating layers involve such operations as: (a) passing a mixture of silicon tetrachloride ($SiCl_4$) and ammonia ($NH_3$) over the substrate being coated in a carrier gas and heating the substrate to about 1,000° C.; or (b) passing a mixture of silane ($SiH_4$) and ammonia (or alternatively, a mixture of ammonia and any chlorosilane such as $SiH_2Cl_2$ or $SiHCl_3$) over the substrate being coated which is heated to a temperature between about 800° and 1,000° C.

A typical CVD of $Si_3N_4$ on a ceramic silicon nitride substrate to yield a coating of about 2½ mils utilizes the silane and ammonia mixture for about 2 hours at 1,000° C.

Practically any inert, shapeable, high temperature refractive substrate designed with adequate mechanical strength and having about the same and generally matching coefficient of thermal expansion as silicon nitride, per se, can be utilized in practice of the present invention. This coefficient is on the order of $3 - 4 \times 10^6/°$ C. Beneficially, the substrate is graphite, fused silica (i.e., quartz), boron nitride, ceramic-bonded and/or sintered silicon nitride compositions — such as those bonded with magnesium and aluminum oxides — and the like or equivalent. The latter include such metals as molybdenum (Mo), tantalum (Ta) and tungsten (W).

The CVD applied layer of $Si_3N_4$, resulting from the nitriding of silicon in known ways, can have any desired thickness. Sometimes, heavier coatings are desirable. Usually, however, a coating thickness in the range of from about 1 to about 10 mils (i.e., about $25 \times 10^{-4}$ to $25 \times 10^{-3}$ cm) is satisfactory. Frequently, coating layers on the somewhat thinner side of less than 5 or so mils ($12.5 \times 10^{-3}$ cm.) in thickness or even under and up to 2½ mils ($6.25 \times 10^{-3}$ cm/) are found to be entirely suitable. A good uniformity and evenness in the applied coating is generally advantageous.

The shaping dies 14 and 16 may be of any desired design best suited for the ribbon growing procedure being followed. Generally, the dies have a length at least as great as the width of the ribbon 18 being pulled therethrough from the melt 17 of liquid silicon. The melt 17 is frequently produced by heating a solid silicon bar or another particulate form of feed (neither of which is shown), which may be monocrystalline or polycrystalline. Any of the conventional dopants may be incorporated in the silicon. The melt may be formed by a suitable heating means (not shown), such as an R. F. (radio frequency) coil outside of the crucible. The configuration of the crucible is not important and it may be round, elliptical, rectangular, etc. Of course, other than R. F. heating means may alternatively be employed.

To faciliate R. F. heating, the ribbon-forming apparatus may oftentimes be supported by suitable susceptor elements (not shown). These, in known manner, are actually heated by the R. F. coil employed so as, in turn to heat the solid silicon feed stock to form the liquid silicon melt 17. Susceptors are conventionally and preferably made of graphite. This material not only provides a support but also is readily heated by an R. F. coil. Susceptors can also be of other high temperature-resistant materials, such as molybdenum or tungsten.

The ribbon-forming devices are usually substantially symmetrical. The coated substrate parts of the assemblies can be machined in advance of coating and fabrication for greater ease in construction.

In operation, the molten polycrystalline silicon supplies are usually replenished by feen stock at a rate which corresponds essentially to the withdrawal rate of the grown silicon ribbon 18 so that the level of the melt 17 remains substantially constant. A temperature gradient is produced in the melt. The temperature of the liquid silicon melt just above the apex is not far removed from that of the melting point of silicon. As a result of the steep temperature gradient, the silicon solidifies just about as it leaves the melt. Practice of the present invention enables one to readily make silicon ribbons 1.5 centimeters wide and 0.05 centimeters thick at minimum rates of at least 10 linear centimeters per hour.

Additionally, the present inventions' practice very advantageously provides silicon ribbon products that are free from deleterious inclusions which usually are found when other substrate materials are employed in the apparatus with which the ribbon is produced. This is of obvious great importance.

For example, when the popularly employed graphite crucibles and/or dies are used in the operation, there is generally formed a stable silicon carbide (SiC) product of reaction between the hot silicon being handled and the carbon in the graphite substrate. This SiC material results in undesirable solid particles or inclusions form (oftentimes characterized as "whiskers") in the grown silicon ribbon product. These whiskers interfere with crystal growth and degrade resultant crystal ribbon quality. In particular illustration of this, the efficiency in solar cells of silicon ribbon crystals having SiC whisker inclusions therein may be reduced to as low as 5% from the normal 15% or so found with silicon materials free of such inclusions. Likewise, in semiconductor and the like applications, it is known that silicon stock material having SiC inclusions exhibit a different diffusion rate than inclusion-free stock and also that the lifetime of a silicon electronic carrier goes down drastically if the carbon concentration therein is too high.

What is claimed is:

1. In an apparatus for growing single crystal thin sheets of silicon by seed pulling from a melt contained in a crucible through a forming die comprising a crucible for molten silicon and a die for shaping the growing crystal extending into contact with the melt, the improvement which comprises coating the surfaces of said crucible and said die which come in contact with said silicon melt with a protective layer of pyrolitic silicon nitride applied by chemical vapor deposition to form a non-porous non-wetting $Si_3N_4$ coating thereon, said crucible and die being made of a refractory material selected from the group consisting of graphite, quartz, boron nitride, ceramic-bonded and sintered silicon nitride compositions, molybdemum, tantalum, and tungsten, said refractory material having a thermal coefficient of expansion about the same as that of $Si_3N_4$, said $Si_3N_4$ coating having an average thickness of between about $25 \times 10^{-4}$ and $25 \times 10^{-3}$ cm.

2. Apparatus according to claim 1, wherein said $Si_3N_4$ coating has an average thickness of about $12.5 \times 10^{-3}$ cm.

* * * * *

UNITED STATES PATENT OFFICE
CERTIFICATE OF CORRECTION

Patent No. 4,090,851                    Dated May 23, 1978

Inventor(s) Samuel Berkman et al.

It is certified that error appears in the above-identified patent and that said Letters Patent are hereby corrected as shown below:

Column 4, line 12, "feen" should read -- feed --.

Column 4, line 56, "non-wetting" should read -- wetting --.

Signed and Sealed this

Twelfth Day of December 1978

[SEAL]

Attest:

RUTH C. MASON  
Attesting Officer

DONALD W. BANNER  
Commissioner of Patents and Trademarks